(12) United States Patent
Chung

(10) Patent No.: US 6,399,178 B1
(45) Date of Patent: Jun. 4, 2002

(54) RIGID ADHESIVE UNDERFILL PREFORM, AS FOR A FLIP-CHIP DEVICE

(75) Inventor: Kevin Kwong-Tai Chung, Princeton Township, NJ (US)

(73) Assignee: Amerasia International Technology, Inc., Princeton Junction, NJ (US)

( * ) Notice: Subject to any disclaimer, the term of this patent is extended or adjusted under 35 U.S.C. 154(b) by 0 days.

(21) Appl. No.: 09/338,477

(22) Filed: Jun. 22, 1999

Related U.S. Application Data

(63) Continuation-in-part of application No. 09/226,543, filed on Jan. 7, 1999.
(60) Provisional application No. 60/093,363, filed on Jul. 20, 1998.

(51) Int. Cl.$^7$ .................................................. B32B 3/10
(52) U.S. Cl. ........................... 428/131; 439/67; 174/54; 174/255; 174/256
(58) Field of Search ................................ 174/254, 255, 174/256; 439/67; 428/131

(56) References Cited

U.S. PATENT DOCUMENTS

| | | |
|---|---|---|
| 2,014,524 A | 9/1935 | Franz |
| 2,774,747 A | 12/1956 | Wolfson et al. |
| 3,401,126 A | 9/1968 | Miller et al. |
| 3,429,040 A | 2/1969 | Miller |
| 4,113,981 A | 9/1978 | Fujita et al. |
| 4,442,966 A | 4/1984 | Jourdain et al. |
| 5,046,415 A | 9/1991 | Oates |
| 5,056,296 A | 10/1991 | Ross et al. |
| 5,074,947 A | 12/1991 | Estes et al. |
| 5,196,371 A | 3/1993 | Kulesza et al. |
| 5,237,130 A | 8/1993 | Kulesza et al. |
| 5,539,153 A | 7/1996 | Schwiebert et al. |
| 5,611,140 A | 3/1997 | Kulesza et al. |
| 5,667,884 A | 9/1997 | Bolger |
| 5,879,761 A | 3/1999 | Kulesza et al. |
| 5,924,622 A | * 7/1999 | Davis et al. ................ 228/56.3 |

OTHER PUBLICATIONS

M. Alger, Polymer Science Dictionary, Chapman and Hall, 2d ed., 1989, pp. 202–203, 306.*
P. Scharf, T. Coleman and K. Avellar, "Flip Component Technology", IEEE Electronic Component Conference (1967), pp. 269–274, No month.

(List continued on next page.)

*Primary Examiner*—Blaine Copenheaver
*Assistant Examiner*—Christopher Paulraj
(74) *Attorney, Agent, or Firm*—Dann, Dorfman, Herrell & Skillman, P.C.

(57) ABSTRACT

An electronic device comprises one or more electronic components, including flip-chip semiconductor devices, chip resistors, capacitors and inductors and other components, electrically interconnected to an electronic substrate by solder bump interconnections and having a rigid adhesive underfill bonding between the electronic component and the substrate. The rigid adhesive underfill is a preform of an insulating thermoplastic and/or thermosetting resin, or a combination thereof, having a high modulus of elasticity and high glass transition temperature. Preferably, insulating adhesives having a higher melt-flow index are employed to facilitate formation of a void-free bond between the component and the substrate and of a fillet around the edges of the flip-chip or other component, thereby to provide a moisture barrier and additional mechanical strength. The high rigidity and high glass transition temperature of the insulating underfill preform material in combination with the high flow index thereof tend to reduce strain in the solder bumps and other internal stresses, and so improve long-term bonding and contact reliability. Preferably, a number of the rigid adhesive underfill preforms are fabricated together and are applied to a number of the electronic components, e.g., on a wafer, or of the substrates in a panel, before they are separated into individual items.

24 Claims, 6 Drawing Sheets

OTHER PUBLICATIONS

Gilleo, K: "Direct Chip Interconnect Using Polymer Bonding", IEEE 39th Electronic Component Conference, May 1989, pp. 37–44.

R. Lachance, H. Lavoie, A Montanari, "Corrosion/Migration Study of Flip Chip Underfill and Ceramic Overcoating", IEEE Electronic Components and Technology Conference (1997), pp. 885–889, No month.

T.Y. Wu, Y. Tsukada, W.T. Chen, "Materials and Mechanics Issues in Flip–Chip Organic Packaging", IEEE Electronic Components and Technology Conference (1996), pp. 524–534, No month.

B. Rösner, J. Liu, Z. Lai, "Flip Chip Bonding Using Isotopically conductive Adhesives", Electronic Components and Technology Conference, (1996) pp. 578–581, No month.

D. Gamota, C. Melton, "Advanced Encapsulant Materials Systems for Flip Chip", Advancing Microelectronics (Jul./Aug. 1997) pp. 22–24.

R.W. Johnson, D. Price, D. Maslyk, M. Palmer, S. Wentworth, C. Ellis, "Adhesive Based Flip Chip Technology for Assembly on Polymide Flex Substrates", IEEE International Conference on Multichip Modules, 1997, pp. 81–86, No month.

L. Schaper, K. Maner, S. Ang, "Reliability of Large Conductive Polymer Flip Chip Assemblies for Multichip Modules (MCMs)", IEEE International Conference on Multichip Modules (1997), pp. 87–91, No month.

Dr. V. Ozguz, R. DeLosReyes, Dr. K. Chung, Dr. J. Licari, "Flexibible Conductive Adhesive Bumps for Chip Scale Packaging", The Technical Conference At Chip Scale International, May 1998, pp. 15–19.

K. Chung, V. Ozguz, "Flexible Conductive Adhesive as Solder Replacement in Flip Chip Interconnection", Proceedings Semicon West 1998, Jul. 1998, pp. 1–14.

"Cost Effective Solutions for Advanced Semiconductor Interconnection and Packaging", AI Technology, Inc., Jul. 1998.

Product Catalog No. 500, "Magnetool Electromagnets", Magnetool, Inc., pp. 1, 5–7, 12, No date.

"Laminated Stencils The Power Behind Fine Pitch," UTZ Engineering, Inc., (2 sheets), No date.

\* cited by examiner

RIGID ADHESIVE UNDERFILL PREFORM, AS FOR A FLIP-CHIP DEVICE

This Application claims the benefit of U.S. Provisional Application Serial No. 60/093,363 filed Jul. 20, 1998, and is a CIP of U.S. patent application Ser. No. 09/226,543 filed Jan. 7, 1999.

The present invention relates to an underfill preform and, in particular, to an adhesive underfill preform and to electronic devices including an adhesive underfill.

Since the invention of integrated circuits in early 1960's, their use has proliferated and they have become indispensable to the multitude of electronic products that modem society has come to rely on and take for granted. While there are many methods of packaging circuits and other semiconductor chips into functional form, their usefulness is greatly enhanced if the physical size of such packaged electronic devices is small and the cost of such packaged devices is low.

Traditionally, connections to semiconductors are made with fine gold or aluminum bond wires that loop from contact pads arranged around the periphery of the top surface of the semiconductor chip (i.e. the side of the chip on which the electronic circuit has been formed) to a lead-frame, header or other package or substrate to which the bottom surface of the semiconductor chip is attached. The technology of bond wire interconnection has been perfected to such a degree that the cost of each bond wire connection is less than one cent ($0.01 U.S.). The electrical characteristics of thin bond wires looping even over a relatively short distance necessarily introduce unwanted inductance and capacitance into the interconnection and thus reduce the bandwidth and operating rate of the electronic devices. This limitation has become more significant in recent years as a result of the development of much faster microprocessors and higher frequency signal processing and communication devices.

One way to reduce the capacitance and inductance of these interconnections is to shorten the length of the interconnection path. One effective conventional way to accomplish this is by flipping the semiconductor chip over (thus, the appellation "flip chip") so that the contact pads are immediately adjacent to the substrate built on which are formed a corresponding set of contact pads to which the contact pads of the semiconductor may be joined directly. U.S. Pat. No. 3,429,040 entitled "Method of Joining a Component to a Substrate" issued to L. F. Miller describes a flip chip arrangement in which the semiconductor chip is attached to the substrate by solder bumps. The distance between the flip chip and the substrate has been reduced to about 50–100 microns and thereby to enable operation at dramatically higher frequencies.

There are many conventional ways of depositing solder or conductive adhesives for the bonding of electronic components and flip chip semiconductor devices to substrates, such as those set forth, for example in U.S. Pat. No. 3,401,126 entitled "Method of Rendering Noble Metal Conductive Composition Non-Wettable by Solder", U.S. Pat. No. 3,429,040 entitled "Method of Joining a Component to a Substrate", U.S. Pat. No. 4,113,981 entitled "Electrically Conductive Adhesive Connecting Arrays of Conductors', U.S. Pat. No. 5,074,947 entitled "Flip-Chip Technology Using Electrically Conductive Polymers and Dielectrics", U.S. Pat. No. 5,196,371 entitled "Flip Chip Bonding Method Using Electrically Conductive Polymer Bumps", U.S. Pat. No. 5,237,130 entitled "Flip Chip Technology Using Electrically Conductive Polymers and Dielectrics", and U.S. Pat. No. 5,611,140 entitled "Method of Forming Electrically Conductive Polymer Interconnects on electrical Substrates". One problem common to these prior art techniques is that they all require operations that are substantially different from those normally associated with semiconductor fabrication. As a result, a substantially different kind of process is being employed and a new business has evolved in which service companies perform solder deposition onto semiconductor wafers as well as adhesive deposition onto such wafers.

The interconnection of semiconductor devices in flip chip configuration has evolved from the use of very elaborate metallization and metallurgy to form a conductive bump of suitable height to which connection may be made, to the use of a less demanding and inexpensive solder bump. Soldering and solder-bump technology and metallurgy may be changed in known manner to accommodate changes in composition and methods of depositions suitable for lower and higher temperature reflow soldering of such interconnections. The inherent limitation of solder bump technology has become apparent when semiconductor devices are sought to be directly attached to an organic substrate due to the differences in the coefficient of thermal expansion (CTE) of the materials. For example, FR-4 fiberglass substrates have a CTE of 17 ppm/° C. whereas the semiconductor chip has a CTE of 3 ppm/° C. Substantial limitations similarly arise when the size of the semiconductor chip is greater than five millimeters (5 mm) on each edge, even when the flip chip interconnection is made to an alumina substrate which has a CTE of only 7 ppm/° C. The solder joints have a modulus of elasticity of about 10,000,000 psi and so have very little compliance, thereby rendering the solder connections subject to fatigue failures when subjected to cyclical temperature excursions.

Alternatives to solder-based interconnections have been employed. U.S. Pat. No. 4,113,981 entitled "Electrically Conductive Adhesive Connecting Arrays of Conductors" issued to Fujita et al. describes a non-conductive adhesive base that is filled with too few conductive particles to render it conductive, except where it may be compressed. Fujita et al. describes using such adhesive to attach raised contacts where normally non-contacting conductive particles in the non-conductive adhesive are pressed against raised contacts of a device so that the raised contacts of the device are in electrical contact with the raised contact pads of the substrate and where isolation between laterally adjacent contacts is maintained by the insulating resin. In a conventional semiconductor wafer, the contact pads, normally formed of aluminum, are recessed below the final insulating inorganic passivation layer. One of the limitations of the Fujita patent is that the contact pads must extend above the top of the insulating passivation layer or substrate. This additional preparation, either as part of the semiconductor wafer fabrication or as a separate process, tends to increase the cost of the semiconductor device and, therefore, the interconnection. Another limitation of the Fujita interconnection is that only a limited number of conductive paths may be formed within each conductive contact, so that electrical isolation between only a few of the conductor particles can render the interconnection non-conductive, and, therefore, useless.

Isotopically conductive adhesives have long been used for bonding the backside of the semiconductor die to a package before the contact pads of the die are wire-bonded to the package leads and have also found extensive use to attach semiconductor components, chip resistors and chip capacitors in hybrid circuit assemblies and in printed wiring board assemblies. But conductive adhesive connections also impose requirements on the semiconductor wafer fabricators and on circuit board manufacturers that may differ from their normal processing.

An early usage of conductive adhesive for flip chip bonding is suggested by Scharf et al. in an article entitled "Flip-Component Technology", published in the Proceedings of IEEE Electronic Component Conference, 1967 (pp. 269–275). Therein, conductive adhesive bumps were stenciled onto a substrate having an array of sixteen bond pads for each semiconductor die that was to be bonded. Scharf et al. focus on how to create a better stencil for printing precision bumps and state certain advantages of using conductive adhesive, such as lower temperature bonding and lower cost. Subsequently, U.S. Pat. No. 4,442,966, entitled "Method of Simultaneously Manufacturing Multiple Electrical Connections Between Two Electrical Elements" issued to P. Jourdain et al. describes the use of conductive paste for bonding aluminum pads on a semiconductor to a substrate in which the stenciling method of depositing the conductive adhesive bumps on the contact pads is employed and in which pressure and heat are applied during assembly of the semiconductor to the substrate.

The uses of such conductive epoxy adhesives for bonding semiconductor chips and the application of such adhesives have been reported in several articles, such as by K. Gilleo in "Direct Chip Interconnect Using Polymer Bonding", 39th Electronic Component Conference, May 1989, (pp.37–44) and U.S. Patents. The limitations of rigid conductive adhesives therein are similar to those of the solder bump approaches, i.e. the connections tend to fracture under temperature cycling. The adhesive joints in the reported applications employ rigid adhesives having a modulus of elasticity of 1,000,000 psi or higher and, as a result, have very little compliance and are subject to delamination or fracture failures over repeated temperature excursions.

Thus, the major problem facing chip to component or chip to board interconnection is the internal stress arising from the difference between the coefficient of thermal expansion of the silicon of the semiconductor chip and that of the next level board, i.e. the substrate to which the semiconductor chip is attached. Both conventional conductive adhesives and solder-bump technologies are hampered by these high-stress-related failures which are exacerbated by extreme temperature differences and larger chips, as is the trend for modern electronics.

One possible solution to this technological stress problem is to engineer the next level board, i.e. the substrate, to have the same coefficient of thermal expansion as that of the semiconductor chip, e.g., about 3 ppm/° C. While this technical approach has been successfully utilized by some, it is not used extensively because of the undesirable higher cost to both develop and manufacture such a substrate and to create the infrastructure necessary to support such new technology. Even more vexing is the fact that the lowest cost common electronic substrate is a fiberglass laminate with epoxy resin, such as FR-4, which is commonly used in printed wiring circuit boards and which has a CTE of 17 ppm/° C. Conventional commercial electronic equipment almost universally employs FR-4 printed circuit boards. Thus, either an extra intermediate substrate would be required, at added cost, or a specialized substrate material to replace FR-4 would be required. The basic problem remains.

The conventional solution to the stress problem is to seek to spread out the stress using an epoxy underfill dispensed into the space between the semiconductor chip and the substrate that does not contain conductive connections. While properly dispensed underfill does in many cases help to increase the number of thermal cycles that such interconnections can survive by a factor of 6–8, depending on semiconductor die size and the temperature excursions, the inherent problem of balancing the beneficial compressive stress of the high-strength underfill that limits the cycling strain achieved against the devastating shear stress that will delaminate or break the joints or parts remains. Every increase in the dimension of the semiconductor die increases the shear stress, and thus the reliability of the assembled flip chip under thermal cycling must be re-evaluated for each particular range of temperatures. Similarly, when the extreme of a temperature excursion is extended to lower or higher temperature, additional shear stress can adversely affect the reliability of the assembled flip chip, also necessitating expensive re-evaluation testing. While dispensing suitable high-modulus of elasticity underfill can help to increase the ability of the flip chip device assembly to withstand thermal excursion stresses, nevertheless it is limited in terms of both the size of semiconductor device that can be utilized and the differential between the thermal expansion coefficient of expansion of the semiconductor chip and that of the next level substrate. Moreover, at least part of the difficulty with dispensed underfill arises from inconsistent dispensing, incomplete underfill, and voids.

Further, U.S. Pat. No. 5,667,884 entitled "Area Bonding Conductive Adhesive Preforms" issued to Bolger describes sheet preforms for conductive adhesive interconnections, not solder connections. Bolger's preforms comprise a multiplicity of electrically conductive adhesive members, each being separated from the other by a non-electrically conductive adhesive, and being useful in the assembly of multi-chip modules and other electronic devices. Resins generally suitable according to Bolger include high Tg thermoplastic and thermosetting polymers that cure at greater than 120° C. and have a glass transition temperature Tg greater than about 70° C. (column 8, lines 33–46). The adhesive in Bolger's examples I–III, for example, is novolac epoxy resin that forms a relatively rigid adhesive having a Tg which is typically over 150° C. and a modulus of elasticity of over $10^6$ psi, i.e. over one million psi (column 7, lines 46–55). The sheet preforms as described in the Bolger patent, however, appear to remain on the release film on which they are formed until they are attached to an individual semiconductor component or a substrate, perhaps because they may lack dimensional stability if separated therefrom. In addition, Bolger's sheet preforms also have several other undesirable, and perhaps more important, limitations. First, Bolger requires that the conical or domed conductive adhesive elements extend above the surface of the non-conductive adhesive, generally having a height in the range of 125%–225%, and preferably about 150%–200%, of the thickness of the surrounding non-conductive adhesive, while also being less than 150% of its diameter (column 7, lines 8–15). This requirement of Bolger would render making proper interconnections difficult or impossible to achieve with solder which naturally takes on a spherical domed shape. In fact, it appears from Bolger's repetition of the point to be of great importance that care be taken to avoid covering the tops of previously formed conductive adhesive members with the non-conductive adhesive composition (column 12, lines 31–46).

A membrane having a pattern of conductive pads within an insulating matrix employing a high strength adhesive system having a high modulus of elasticity is reported by R. W. Johnson, et. al. "Adhesive Based Flip Chip Technology for Assembly on Polyimide Flex Substrates", *International*

*Conference on Multichip Modules*, (April, 1997). One problem with the approach reported by Johnson et. al. is that their conventional rigid resin system having a high modulus of elasticity, such as a novolac epoxy base resin, cannot accommodate the substantial differences between the coefficients of thermal expansion (CTE) of semiconductor dies or chips and of substrate materials, such as FR4, ceramic and other common rigid substrate materials commonly employed, over the range of thermal temperatures typically specified and/or experienced. The approach of Johnson et al. to employ a flexible substrate that is capable of yielding or flexing may not be compatible with many applications, especially certain computer, telecommunication aerospace and defense applications. An alternate approach of engineering a customized substrate material that closely matches of the electronic components that will be attached thereto is both too expensive for many applications and impractical where the electronic components themselves have a substantially different CTE. In most applications, however, one must eventually connect to an FR4 printed circuit wiring board that has a high CTE of about 17 ppm/° C.

Inherent in all of the foregoing, even in the case of a substrate with its CTE matched to the chip, when the device becomes substantially large, there is still inherent stress caused by of the mismatch between the CTE of the solder or adhesive, typically in the range of about 25 ppm/° C. to over 40 ppm/° C., in comparison to the CTE of 3 ppm/° C. for the silicon chip and 17 ppm/° C. for the FR4 printed wiring circuit board. In order to reduce the strain involved in the solder joints during the thermal excursion from the "zero" stress point of soldering, a dispensed underfill having high rigidity is conventionally used to control the strain involved within the solder conductor columns.

Almost all of the underfill materials used today are liquid epoxies filled with quartz and other insulating particulates to control its CTE to as low a value as possible. These liquid epoxy encapsulants are dispensed around the perimeter of the device, such as a semiconductor chip, after the device assembled to and interconnected with a substrate. In the case of soldered flip chips, such as are commonly called "C4" connections (i.e. Controlled Collapse Chip Connections), the solder interconnections are made by a suitable solder reflow process. If soldering flux is used, it is then removed with a suitable solvent and the device is dried. The liquid encapsulants are intended to be pulled in by capillary action to fill in the space between the flip chip and the substrate not occupied by the solder columns during a curing cycle at high temperature. How well the encapsulant fills the spaces by capillary action before it cures is a strong determinant of the reliability of such device.

However, the high rigidity of the encapsulant also produces high internal stress and also tends to cause delamination under thermal and power cycling. To reduce the tendency to fracture-induced failure, fracture-capturing rubber or soft-phase structures are incorporated and dispersed inside the resin. Because dispensed liquid encapsulants often require a longer time to cure and are difficult to utilize in high-volume applications, there is a need for better formulated products to replace conventional liquid underfill.

While a preferred solution to the stress problem is found in electronic devices employing the flexible adhesive connections described in U.S. patent application Ser. No. 09/166,633 entitled "Flip Chip Devices With Flexible Conductive Adhesive," there remains a need for solder-based interconnections in certain applications, for example, existing electronic devices where the expense or time that would be required to replace the solder-based interconnections is prohibitive or unavailable. In these applications in particular, there is a need for a more reliable and cost effective solution to the stress problem than is provided by dispensed underfill.

Another consideration in attaching semiconductor and other flip-chip components to a substrate is that of obtaining and maintaining intimate interfacial contact between the component and the substrate so that there will be adequate thermal energy transfer which leads to lower temperature operation and to greater reliability. Good thermal conductivity will not be obtained where air, voids or other foreign matter is trapped between the chip and the substrate, and is particularly difficult to obtain where a conventional patterned membrane of conductive and insulating organic polymer adhesive is employed. If a non-flowing dielectric underfill material is used, such as an epoxy of the sort described in U.S. Pat. No. 5,074,947 entitled "Flip-Chip Technology Using Electrically Conductive Polymers and Dielectrics" issued to Estes et al., voids will almost always form along the interface and thus, poor thermal conductivity will result across the interface between the electronic component and the substrate. In addition, if a rigid, non-flowing conductive adhesive of the sort described in the Estes et al. patent is used, the conductive adhesive will be subject to delamination and fracture failures under thermal stress and the interconnections formed thereby will be unreliable; the non-adhering dielectric underfill will not relieve the strain on the conductive adhesive and truly improve the aforementioned reliability.

Accordingly, there is a need for a rigid insulating adhesive underfill preform suitable for use with solder-based interconnections. It is desirable that such preform have high flow so as to reduce the size and incidence of voids and is further desirable that such preform may be employed with a plurality of devices or substrates formed on a single wafer or panel, respectively, which wafer or panel is separated into individual devices or substrates after the insulating preform is applied thereto.

To this end, the present invention comprises a rigid adhesive underfill preform for a substrate having a pattern of contact sites thereon and to include solder bumps comprising: a layer of adhesive material having a pattern of holes therethrough corresponding to the pattern of contact sites of the substrate, the layer of adhesive material having a thickness substantially similar to a height of the solder bumps, and wherein the adhesive material is rigid when cured and has a flow index greater than about 1.2.

According to another aspect of the present invention, a method of making an underfill preform having a pattern of holes therethrough comprises:
 obtaining a mold plate having a substantially flat surface;
 forming on the substantially flat surface a pattern of raised features having a height and corresponding to the pattern of holes;
 depositing a layer of adhesive onto the substantially flat surface;
 drying the layer of adhesive; and
 removing the dried layer of adhesive from the substantially flat surface of the mold.

BRIEF DESCRIPTION OF THE DRAWING

The detailed description of the preferred embodiments of the present invention will be more easily and better understood when read in conjunction with the FIGURES of the Drawing which include.

DESCRIPTION OF THE PREFERRED EMBODIMENTS

Figure 1:
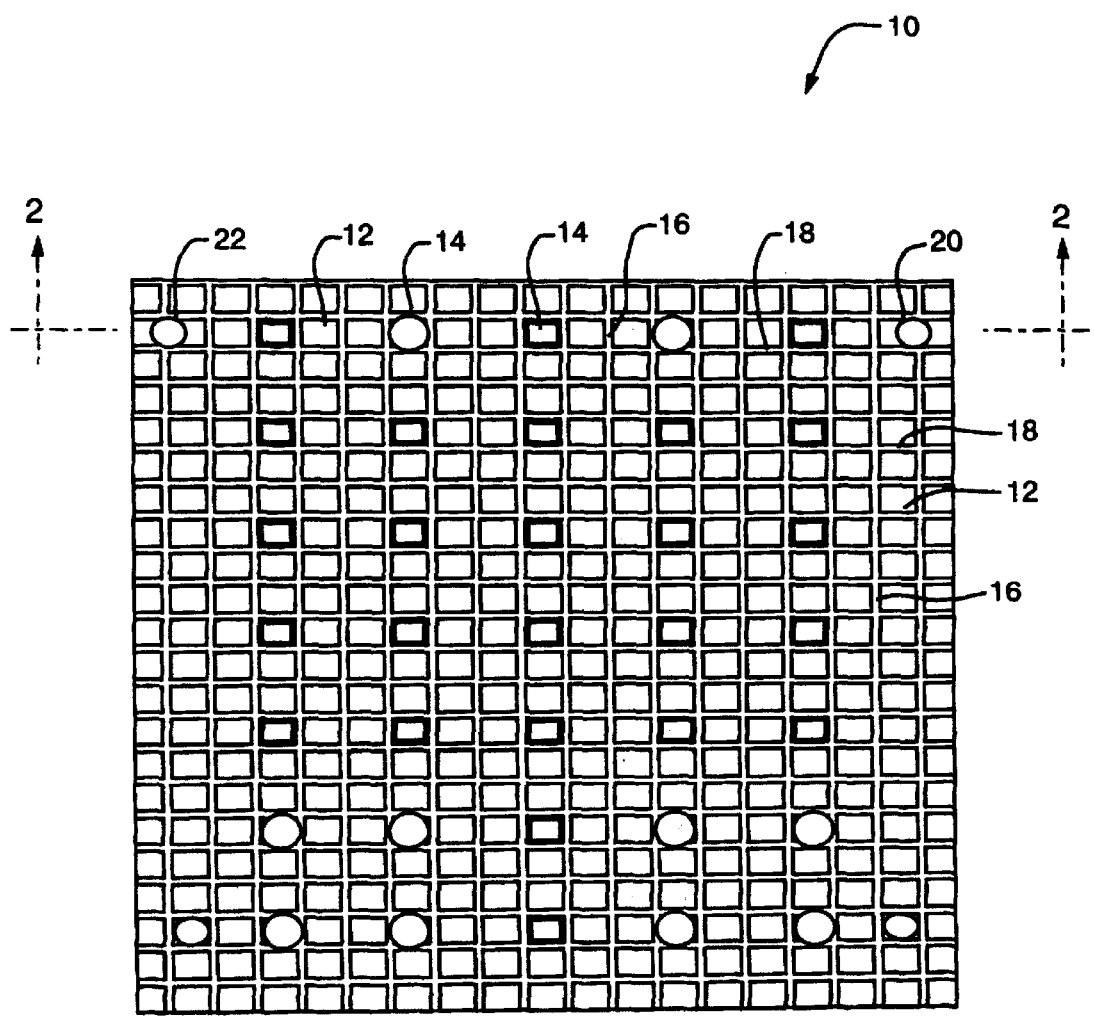
FIG. 1 is a plan view of an exemplary embodiment of a rigid insulating film adhesive underfill preform in accordance with the present invention.

FIG. 1 is a plan view of an exemplary embodiment of a rigid insulating film adhesive underfill preform 10 in accordance with the present invention. A film or sheet 12 of a rigid insulating adhesive is formed having a plurality of openings 14 therein that are patterned to correspond with the pattern of contact pads or sites on a substrate with which rigid adhesive underfill preform 10 is employed. Openings 14 may be circular, rectangular or square as illustrated, preferable to correspond to the shape and size of the contact pads or sites on the afore mentioned substrate. Rigid adhesive underfill preform 10 preferably includes a network of intersecting channels 16, 18 on the surface thereof formed by a plurality of channels 16 running generally in a first direction and a second plurality of channels 18 running generally in a second direction angled with respect to the first direction so as to intersect therewith. The network of channels 16, 18 provide passageways through which gas that might otherwise become trapped and form voids when the rigid adhesive underfill preform is utilized may pass and escape. Underfill preform 10 may also include a plurality of relational alignment holes 20, 22 located in positions that are in known predetermined relationship to the pattern of holes 14 in underfill preform 10.

Figure 2:
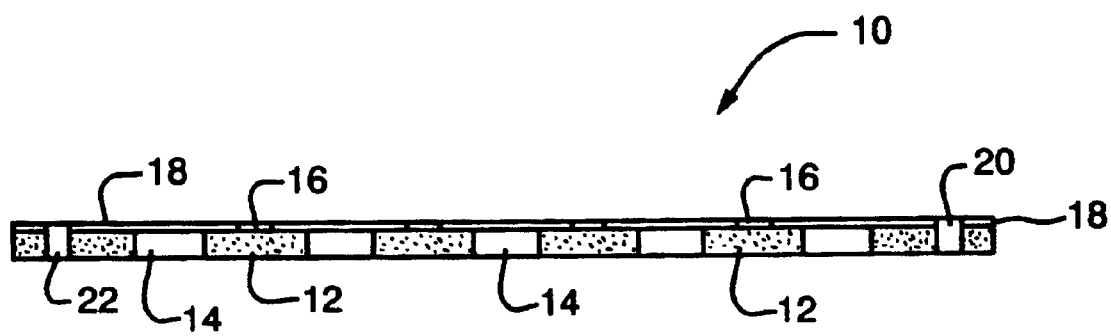
FIG. 2 is a cross-sectional view along the line I—I of the embodiment of the rigid adhesive underfill preform of FIG. 1.

FIG. 2 is a cross-sectional view taken along the line I—I of the embodiment of the rigid adhesive underfill preform 10 of FIG. 1 to illustrate the pattern of holes 14 and the relational alignment holes 20, 22 through rigid adhesive underfill preform 10. Channels 18, shown by a dashed line, are on one surface of rigid adhesive underfill preform 10 (in a side-to-side orientation in FIG. 2) and channels 16 are visible in cross-section on the same surface in the rigid insulating adhesive sheet 12. A typical rigid adhesive underfill preform 10 may have holes 14 that are as small as 100–200 microns in diameter (for a circular hole 14) and may have a thickness in the range between about 75 and 150 microns.

Figure 3:
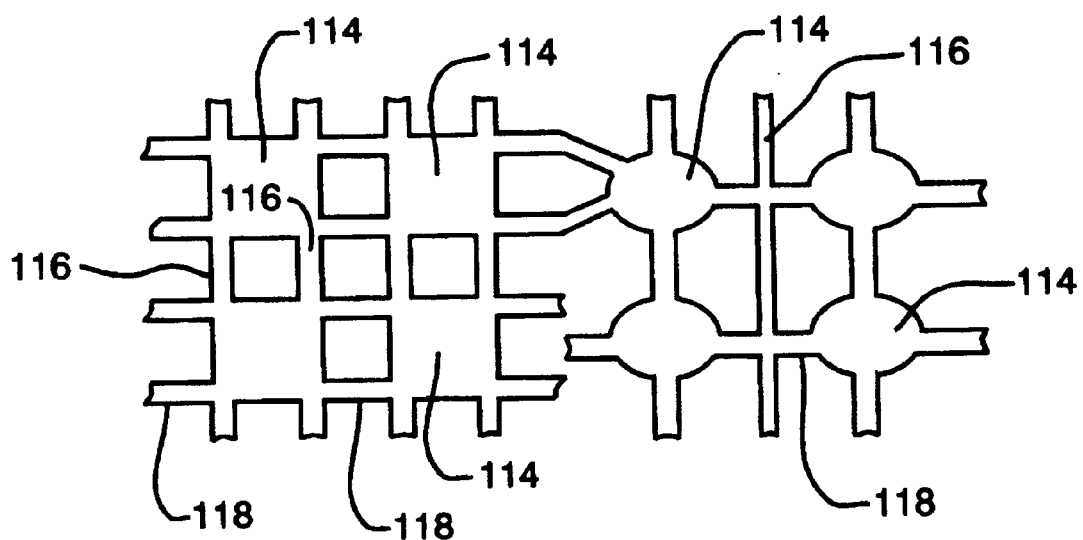
FIG. 3 is a plan view of a portion of a stencil employed in making the rigid adhesive underfill preform of FIG. 1.

FIG. 3 is a plan view of a portion of a stencil 110 that may be employed in depositing an insulating adhesive material in the making the rigid adhesive underfill preform 10 of FIG. 1. Stencil 110 includes a plurality of filled areas or covers 114 corresponding to the size and shape of the holes 12 to be formed in rigid adhesive underfill preform 10 to cover such areas and thereby prevent deposition of the insulating adhesive thereat. Covers 114 are supported in the stencil 110 by a network of narrow tie bars 116, 118 including a plurality of narrow tie bars 116 running generally in a first direction and a second plurality of narrow tie bars 118 running generally in a second direction angled with respect to the first direction so as to intersect therewith. The tie bars 116, 118 may be in any convenient pattern suitable for supporting covers 114 in stencil 110 in a pattern corresponding to the pattern of openings to be formed in the insulating film layer 12 of rigid adhesive underfill preform 10, however, a pattern of horizontal and vertical tie bars is often convenient. The width of narrow tie bars 116, 118 is made very small, typically about the same as the thickness of the stencil or screen, which is, for example, typically about 4–6 mils thick, so that gaps will not be formed in rigid adhesive underfill preform 10 thereby, but only depressions therein will result, which depressions are channels 16, 18. Because the pattern of tie bars 116, 118 that defines the network of channels 16, 18 that are formed in rigid adhesive underfill preform 10 are in an intersecting pattern, so are channels 16, 18 in an intersecting pattern.

Rigid adhesive underfill preform 10 may be formed in the following manner. Stencil 110 is positioned for stenciling with respect to a sheet of release liner or a release substrate and an insulating adhesive material is deposited onto the release liner through stencil 110. Stencil 110 is immediately removed from the release liner and tie bars 116, 118 thereof leave very fine gaps in the deposited layer 12 that quickly close due to the surface tension action of the wet adhesive, but which leave depressions in the freshly deposited insulating adhesive layer 12 that define the network of channels 16, 18.

The preferred insulating adhesives are rigid adhesives, i.e. those adhesives having a high modulus of elasticity or rigidity when cured so as to provide compressive stress between a device and the substrate to which it is attached and thus reduce the strain on the solder joints, but being strong and flexible when dried or B-staged to facilitate handling and lamination to a device or substrate. Such adhesives can be thermoplastic-based or thermosetting-based polymers, like that of epoxy, or a combination or blend thereof. In any event, the preferable adhesive should have a high glass transition temperature Tg so that it maintains rigidity over the majority of the range of useful temperatures (e.g., the operating and storage temperature ranges) of the device with which it is utilized. For example, most applications require testing at an upper temperature of 85° C. for commercial electronic devices and at 150° C. for military electronic devices. Accordingly, the glass transition temperatures of such resins are preferably higher than 85° C. and even more preferably near or higher than 150° C. Suitable thermoplastic adhesives include those made with polyester-based resins, polysulfones and variations thereof, polysulfides and variations thereof, and thermoplastic polyimide and variations thereof. Suitable adhesives are not limited to cross-linked polymers having relaxational characteristics in order to be drawn under a flip-chip device and fill in the space thereunder, as is the case for dispensed underfill adhesives.

Suitable adhesives should have a certain flow characteristic to render them particularly useful for a rigid adhesive underfill preform. Unlike the liquid encapsulants employed as dispensed underfill that must be pulled into the underfill space by capillary forces, the film adhesive of a rigid underfill preform is induced to flow under pressure at attachment of a device to a substrate. Thus, preferred insulating film adhesives will have high flow index at a temperature substantially lower than the reflow temperature of solder so that they may be easily laminated onto the device or circuit substrate, preferably onto a plurality of semiconductor dies in the form of a semiconductor wafer or a plurality of electronic substrates or printed wiring circuit boards in the form of a panel of substrates or circuit boards. In the case of film adhesives, thermoplastic and thermosetting film adhesive resins may be used and, if necessary, be modified to have a suitable flow index by the addition of a high melt flow epoxy resin, by the selection of the shape of the particles of material employed as filler in the adhesive, or by changing the curing time of the adhesive. For example, changing from elongated shaped particles to more spherical shaped particles tends to increase the flow of the adhesive. Likewise, extending the curing time of the adhesive tends to increase the flow thereof because there is more time for the adhesive to flow before it becomes filly cured.

As used herein, flow index or melt-flow index refers to the degree to which an adhesive flows when cured under a particular set of conditions of temperature and pressure. Flow index $F_{T,P}$ is the ratio of the area covered by an adhesive after curing at a temperature T and a pressure P to the area of the adhesive before curing. I.e.

$$F_{T,P} = \frac{\text{Area-of-Adhesive(Post-cure)}}{\text{Area-of-Adhesive(Pre-cure)}}$$

By way of example, if a one-inch-square adhesive when cured between two glass plates at a temperature of 150° C. and under a pressure of 10 psi flows to have a cured area of 1.25 square inches, then $F_{T,P} = F_{150\ C.,\ 10\ psi} = 1.25\ in^2/1.0\ in^2 = 1.25$.

Preferably, insulating adhesives having a higher melt-flow index are employed to facilitate formation of a substantially void-free bond between the component or device to be attached and the substrate to which it is attached, and to facilitate formation of a fillet around the edges of the flip-chip or other component, thereby to provide a moisture barrier and additional mechanical strength. Whereas conventional adhesives typically exhibit a melt flow index of about 1–1.1, suitable adhesives employed in the present invention have a melt flow index greater than 1.2, and preferably at least 1.5. Typically, the melt flow index is measured at temperatures in the range of about 150–250° C. and with pressure of 30 psi or less. However, other temperatures and other pressures may be employed, e.g., temperatures below the solder reflow temperature and/or pressures up to 100 psi. The melt flow index characteristic of the adhesive is aided by the presence of channels or other features in the surface of the rigid adhesive underfill preform to further facilitate the escape of air or gas, thereby to form a void-free interface that not only evens out the stress thereat so as to improve reliability, but also aids in the transfer of thermal energy across the interface, as for cooling of a device.

It is also important for the adhesive of a rigid adhesive underfill preform to have relatively low thermal expansion coefficient so that the internal stress it induces due to compressive force will not be detrimental to the integrity of the device interconnections, such as by causing delamination and fracture failures. Most polymeric molecular structures, including polymer adhesives, have a "planar zigzag" molecular configuration that exhibits a typical coefficient of thermal expansion (CTE) of approximately 60 ppm/° C. at temperatures below the glass transition temperature Tg and 100–300 ppm/° C. above Tg, depending on the cross-link density. While some liquid crystal polymers have a much lower CTE, they are typically difficult to flow at temperatures less than 220° C. which is the melting temperature for tin-lead solder. For the present invention, the preferred adhesives are made with thermoplastic and thermosetting resin having a high Tg, but which are loaded or filled with 30–65% by volume of filler, such as quartz particles or beads, to control, i.e. reduce, the coefficient of thermal expansion. Preferably, the glass transition temperature of the adhesive is 85° C. or higher, and the coefficient of thermal expansion is reduced to less than 40 ppm/° C. Further reduction of the CTE of the rigid adhesive, for example, to 35 ppm/° C. or 30 ppm/° C. or even to 25 ppm/° C. increases the ability of a device fabricated with the rigid adhesive underfill preform of the present invention to withstand a greater number of thermal cycles over a given temperature range, or, alternatively, to withstand a given number of thermal cycles of an increased range of temperature.

In some cases, fillers that are low in reactivity and inert to operating conditions of temperature and moisture are added to the useful resin to enhance the thermal conductivity of the insulating adhesives. Typical fillers employed include alumina, diamond, aluminum nitride, silicon carbide, magnesium oxide, zinc oxide, and other insulating oxides, and combinations thereof. Typical volume fractions of loading are also in the range of 30–65% by volume, with the highest volume of filling that will permit the adhesive to be induced to flow suitably at a temperature low-enough to avoid premature adhesive curing being preferred.

Suitable insulating film adhesives are typically dry after B-staging to a solid form, which is defined as either partial cross-linking of the polymer or elimination of solvent. Adhesives that are tacky after B-staging so as to exhibit pressure sensitive adhesive properties are also suitable. It is noted that while these adhesives are rigid after curing, i.e. they have a cured modulus of elasticity greater than about 1,000,000 psi, they preferably are flexible after drying or B-staging so as to facilitate handling and laminating the B-staged rigid adhesive underfill preform 10 to a substrate.

Figure 4:
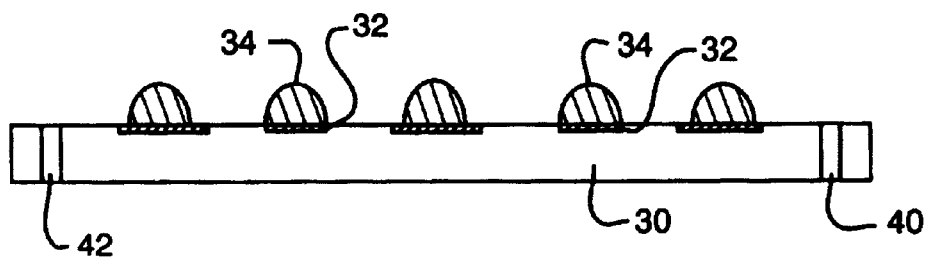
FIG. 4 is a cross-sectional view of an exemplary single substrate, such as a semiconductor die within a wafer or a next-level circuit board in a panel of circuit boards, with which the rigid adhesive underfill preform of FIGS. 1 and 2 may be employed.

FIG. 4 is a cross-sectional view of an exemplary single substrate 30 with which the rigid adhesive underfill preform 10 of FIGS. 1 and 2 may be employed. Substrate 30 may be an electronic component, such as a semiconductor die individually or within a semiconductor wafer on which a plurality of circuits have been formed, an electronic substrate individually or in a panel of such substrates, or a next-level circuit board individually or in a panel of circuit boards, or an other sort of electronic device, having contact pads 32 on a surface thereof. On each of contact pads 32 is deposited a bump of solder 34, which may be deposited by screening, stenciling, printing or other method solder paste or cream that includes fine particles of solder, and which may be heated to the melting point of the solder particles to reflow the solder bumps 34 on the contact pads 32. Typically, solder bumps 34 are deposited as cylindrical or rectangular bumps of solder paste or cream and become conical or domed in shape after being heated to reflow in the locations where they are deposited before being utilized to attach a device onto a circuit board or other substrate. The pattern of contact pads 32 on substrate 30 is the pattern that defines the pattern of holes 14 in rigid adhesive underfill preform 10. Substrate 30 also includes relational alignment holes 40, 42 that are in the same known predetermined positional relationship to the pattern of contact pads 32 of substrate 30 as are the corresponding relational alignment holes 20, 22 of rigid adhesive underfill preform 10 to the pattern of holes 14 thereof.

Figure 5:
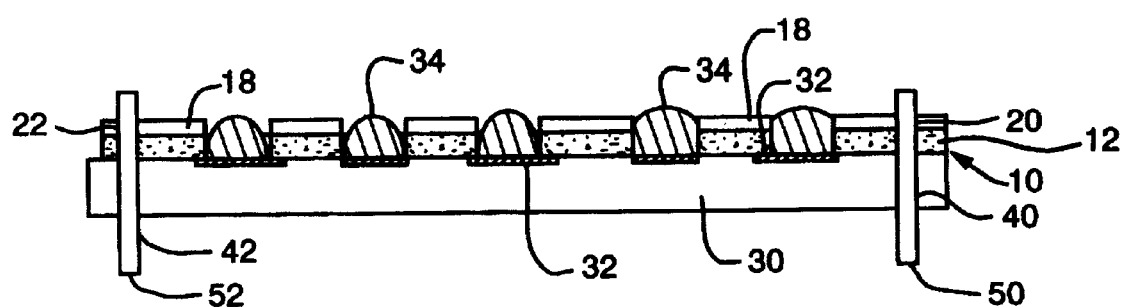
FIG. 5 is a cross-sectional view of the rigid adhesive underfill preform of FIGS. 1 and 2 laminated over the exemplary single substrate of FIG. 4.

FIG. 5 is a cross-sectional view of the B-staged rigid adhesive underfill preform 10 of FIGS. 1 and 2 laminated over the exemplary single substrate 30 of FIG. 4. B-staged rigid adhesive underfill preform 10 and substrate 30 are aligned so that the solder bumps 34 of substrate 30 are located in the holes 14 in the insulating film 12 of rigid adhesive underfill preform 10. Alignment of B-staged rigid adhesive underfill preform 10 and substrate 30 is preferably aided by employing alignment or guide pins 50, 52 to align the respective relational alignment holes 20, 22 of B-staged rigid adhesive preform 10 with the corresponding respective alignment holes 40, 42 of substrate 30. B-staged rigid adhesive underfill preform 10 may be tacked to substrate 30 by heating B-staged rigid underfill preform 10 and pressing it against substrate 30 for a short time to cause it to tack thereto, but not to a temperature that will produce curing of the insulating adhesive layer 12, particularly if layer 12 is formed of a thermosetting adhesive.

The thickness of insulating adhesive layer 12 is preferably about the same as the height of the solder bumps 34, but may be slightly thicker or thinner than the height of the solder bumps 34, for example, about 10–15% larger or smaller, but not more than about 20%. This range is adequate so that reliable solder interconnections may be formed without an excess of solder that could lead to solder bridges between closely-spaced adjacent interconnections. Typically, the height of the solder-bumps 34 is about 75 to 150 microns, or even 200 microns, but may be more or less without departing from the present invention. Thus it is important to accurately control the thickness differential between the solder bumps 34 and the adhesive layer 12 so that the solder joints between the device and the substrate may be complete and yet be surrounded with rigid adhesive filling the areas surrounding the solder joints.

In the case where substrate 30 is a semiconductor die within a semiconductor wafer on which a plurality of circuits have been formed, an electronic substrate in a panel of such substrates, or a next-level circuit board in a panel of circuit boards, such wafer or panel is singulated, as by cutting, scribing and breaking or sawing, into individual dies, substrates or circuit boards 30, each of which has an individual rigid adhesive underfill preform 10 laminated thereto.

Figure 6:
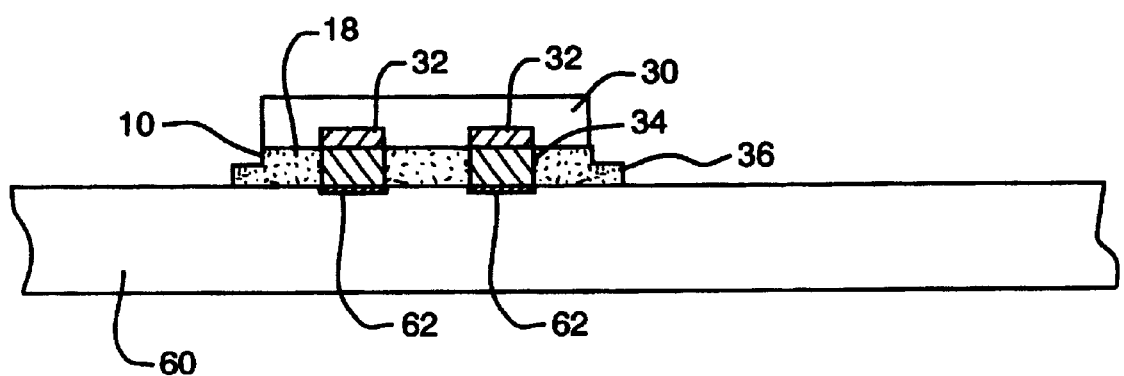
FIG. 6 is a cross-sectional view of the laminated single substrate of FIG. 5 attached to a next-level substrate by the rigid adhesive underfill preform of FIGS. 1 and 2.

FIG. 6 is a cross-sectional view of the laminated single device or substrate 30 of FIG. 5 attached to a next-level substrate 60 by the rigid adhesive underfill preform 10. Next-level substrate 60, which may be an electronic substrate or a printed wiring circuit board, for example, has a pattern of contact pads 62 thereon that correspond to the pattern of contact pads 32 on device or substrate 30. Device or substrate 30 is positioned and pressed against next-level substrate 60 so that the pattern of contact pads 32 of substrate 30 and that of contact pads 62 of next-level substrate 60 are aligned. Substrate 30 and/or next-level substrate 30 are heated to a temperature sufficient to melt the solder of solder bumps 34 to form solder connections between corresponding ones of the contact pads 32 and 62, and to cure the B-staged adhesive of rigid adhesive underfill preform 10. The combination of temperature and pressure causes the insulating adhesive layer 12 to flow to form essentially void-free bonded interfaces with substrate 30 and with next-level substrate 60, and to allow any gas that might otherwise be trapped to escape via the network of channels 16, 18.

Two aspects relating to the present invention contribute to facilitate the removal of air or other atmosphere that can become trapped when two flat surfaces, such as substrate 30 and B-staged rigid adhesive underfill preform 10, are mating to each other. One aspect is that the rigid insulating adhesive employed in adhesive layer 12 should be easily induced to flow under the conditions under which a device or substrate 30 is attached to a next-level substrate 60 and so fill any voids.

Another important aspect of flow-induced removal of trapped air or atmosphere is to provide a temperature differential between the substrate that has solder bumps thereon and the substrate to which it is to be interconnected. In the case adhesive layer 12 is formed of a thermosetting insulating adhesive film, the thermosetting adhesive will tend to cure rapidly at the melting temperature of the solder bumps 34, i.e. when the solder bumps start to flow at about 220° C. Even where an indium-type solder having a lower reflow temperature of about 150° C. is utilized, the thermosetting adhesive may cure prematurely if allowed to reach such temperature before the solder bumps 34 have the chance to melt and reflow to form proper interconnections between the contact pads of the respective substrates 30, 60. In these cases, the substrate 60 that does not have the solder bumps 34 (and also does not have the B-staged rigid adhesive underfill preform 10) should be preheated to a temperature substantially above the reflow temperature of the solder bumps. The temperature to which such substrate 60 should be preheated is preferred to be in the range of 10–100° C. above the solder reflow temperature. To prevent the degradation of the circuitry, if any, on such substrate by these higher temperatures, the time of preheating should be kept as short as possible, and the heating rate should be as fast as possible, for example, in the time frame of a few seconds to a few minutes. This preheating process can also be arranged for partial preheating in separate steps such that the temperature of the substrate 60 is first raised to a relatively high temperature, such as to about the 150° C. to 220° C. melting temperature of solder, before being placed onto a heating chuck for rapid heating to the desired higher temperature for forming solder interconnections during attachment to substrate 30.

While the substrate 30 having solder bumps 34 and B-staged rigid adhesive underfill preform 10 thereon may also be preheated, it is preheated to a lower temperature that will not prematurely cure the thermosetting adhesive film 12, typically, a temperature in the range of 80–150° C. is satisfactory. The time of this preheating should also be short, typically in the range of a few seconds to a few minutes. When the solder bumps 34 of substrate 30 touch the surface of substrate 60 which is at a substantially higher temperature than the solder reflow temperature, solder bumps 34 will reflow rapidly to form proper solder joints between the respective contact pads 32 and 62 of substrates 30 and 60. While the surface of B-staged rigid adhesive underfill preform 10 touching the heated surface of substrate 60 will gel and cure rapidly, the heat transfer in the adhesive layer 12 is relatively slower than in the solder bumps 34 and still affords the adhesive of adhesive layer 12 to flow and eliminate trapped air or other atmosphere. The time for which a device or substrate 30 may be placed against a substrate 60 with pressure typically afforded by typical flip-chip-bonding machines, such as those available from MRSI located in Chelmsford, Mass., Kulicke & Soffa Industries located in Willow Grove, Pa., and European Semiconductor Equipment Company (ESEC) located in Cham, Switzerland, are satisfactory. Once a proper fillet of the rigid adhesive underfill preform 10 is formed at the edges of the device or substrate 30, the joined substrates 30, 60 are preferably kept at an elevated, but substantially lower, temperature to complete the curing of the thermosetting adhesive, for example, a temperature in the range of 100–200° C. to allow completion of the cross-linking of the adhesive polymer without pressure being applied. With adhesives having an appropriately short post-curing time, the post-curing may be performed in an assembly-line manner for a few minutes, such as by keeping joined substrates 30, 60 on a heated platform that is passed through a belt-oven at the substantially lower curing temperature. If post-curing for a longer time is required, the joined substrates 30, 60 may be placed in separate batch-processing oven for post curing.

Figure 7:
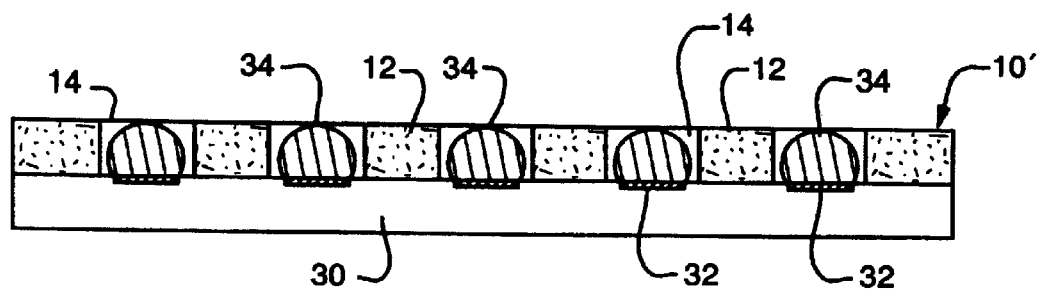
FIG. 7 is a cross-sectional view of an alternative embodiment of the rigid insulating film adhesive underfill preform in accordance with the present invention.

FIG. 7 is a cross-sectional view of an alternative exemplary embodiment of the rigid insulating film adhesive underfill preform 10' laminated over an exemplary singulated circuit site of substrate 30. Rigid adhesive underfill preform 10' differs from rigid adhesive underfill preform 10 of FIGS. 1 and 2 in that holes 14' in insulating adhesive layer 12 are sized to be larger than the cross-wise dimensions of solder bumps 34 formed on the contact pads 32 of substrate 30. As a result, the spaces immediately around the conductive solder bumps 34 are not filled. This arrangement is advantageous in that it allows more volume in which the melted solder can flow to form an inter-metallic joint with contact pads 32 and with corresponding contacts on the next-level substrate. The height of the solder bumps 34 and of the rigid insulating film adhesive underfill preform 10' are preferably substantially the same.

In addition, preform 10' may include a network of channels 16, 18 for venting air or gas that might otherwise become trapped upon attachment of substrate 30 to a next-level substrate as described above. Where preform 10' is formed by screening the adhesive, channels 16, 18 may be formed in a one-pass screening operation. Where preform 10' is formed by stenciling the adhesive, channels 16, 18 may be formed in a two-pass stenciling operation in which the stencil for the first pass depositing a first adhesive layer does not include channels 16, 16 and that for the second pass depositing a second adhesive layer on top of the first adhesive layer does include tie-bars defining channels 16, 18.

Figure 8:
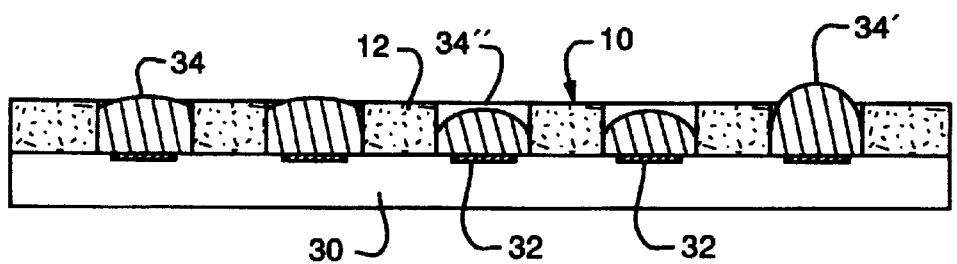
FIG. 8 is a cross-sectional view of an aspect of an embodiment of the rigid insulating film adhesive underfill preform in accordance with the present invention.

FIG. 8 is a cross-sectional view of another aspect of an embodiment of the rigid insulating film adhesive underfill preform 10 in accordance with the present invention laminated to a substrate 30. Solder bumps 34, 34' and 34" are shown as being of different heights for purposes of illustrating that the height of solder bumps 34 may be slightly greater or slightly less than the thickness of rigid adhesive underfill preform 10, for example, by 10%–15% as described above. Thus, the tops of solder bumps 34' are slightly protruding above the top surface of preform 10 and the tops of solder bumps 34" are slightly recessed below the top surface of preform 10. In any given preform, it is understood that all of the solder bumps would be of about the same size. While the arrangement having projecting solder bumps 34' is advantageous in favoring the formation of proper solder interconnections between the contacts 32 and 62 of the substrate 30 and the next-level substrate 60 when they are attached under heat and pressure, the arrangement having slightly recessed solder bumps 34" is advantageous in favoring the flowing of the adhesive to attain broad adhesion of the adhesive to the substrate 30 and to the next-level substrate 60. In most applications, however, it is preferable that the solder bumps 34 have a height that is about the same as the thickness of the adhesive preform 10 to produce heating of the solder bumps 34 to form inter-metallic connections between the respective contacts 32, 62 while producing sufficient flow of the adhesive to form strong broad bonds. In addition, preform 10 may include a network of channels 16, 18 for venting air or gas that might otherwise become trapped upon attachment of substrate 30 to a next-level substrate as described above.

In addition to the rigid adhesive underfill preforms that are utilized with substrates having pre-applied solder and conductive bumps, rigid adhesive film underfill preforms can also be made to include the conductive solder bumps and to be applied to a substrate in similar fashion as that described above. In this particular alternative embodiment of the invention, the conductive solder bumps will be embedded in an insulating rigid adhesive film in proper pattern, pitch and position as that of the contact pads of the substrate to which the rigid adhesive underfill preform will interconnect.

Figure 9:
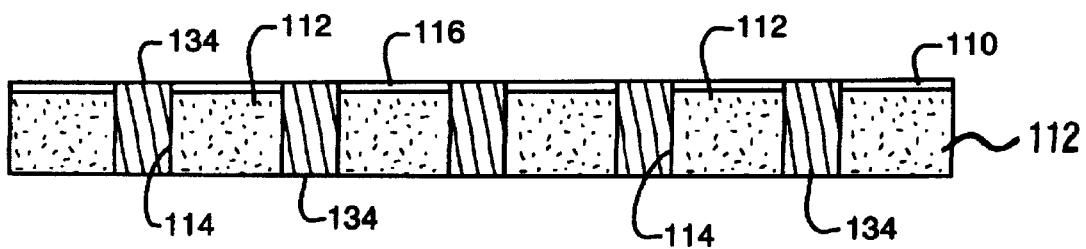
FIG. 9 is a cross-sectional view of an alternative embodiment of the rigid insulating film adhesive underfill preform in accordance with the present invention.

FIG. 9 is a cross-sectional view of an alternative embodiment of a rigid insulating film adhesive underfill preform 110 in accordance with the present invention. Rigid insulating film adhesive underfill preform 110 includes an insulating film adhesive layer 112 similarly to adhesive layer 12 of rigid insulating film adhesive underfill preform 10 described above. Formed in layer 112 is a pattern of holes 114 corresponding to the pattern of contact sites of the substrate or device with which rigid adhesive underfill preform 110 is to be employed. Holes 114 in adhesive layer 112 are filled with columns 134 of solder paste or solder cream, such as by roll coating or by deposition utilizing a screen, stencil or mask, or other suitable method. Holes 114 are filled so that the tops of solder columns 134 are at the same level or protrude slightly above the surface of insulating adhesive layer 112, for example, by 10%–15%, but not more than about. Rigid adhesive underfill preform 110 is B-staged so that the insulating adhesive 112 is dry to the touch and solder columns 134 are retained therein. In its B-staged condition, rigid adhesive underfill preform 110 is flexible and may be handled for placement for use.

Figure 10:
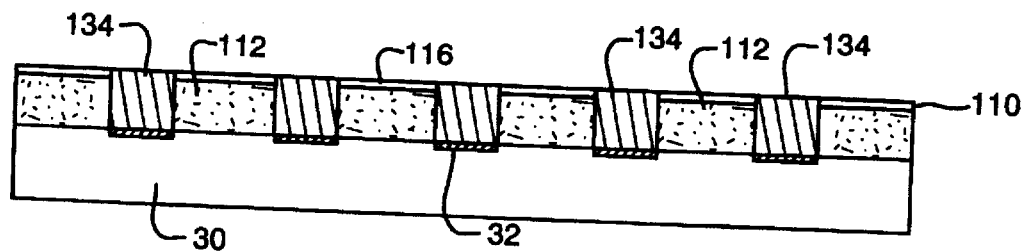
FIG. 10 is a cross-sectional view of the rigid adhesive underfill preform of FIG. 9 laminated over an exemplary single substrate.

In FIG. 10, B-staged rigid adhesive underfill preform 110 is laminated to a device or substrate 30 having a pattern of contact pads or sites 132 thereon. Rigid adhesive underfill preform 110 is aligned with substrate 30 so that the pattern of solder columns 134 of preform 110 corresponds with the pattern of contact pads 132 of substrate 30. Rigid adhesive underfill preform 110 is heated to a temperature sufficient to tack it to substrate 30, but not to a temperature high enough to cure the adhesive layer 112 or melt the solder in solder columns 134. Substrate 30 with rigid adhesive underfill preform 110 attached thereto is then ready for attachment to a next-level substrate or circuit board as described above. It is noted that rigid adhesive underfill preform 110 and substrate 30 may each include a like set of relational alignment holes in the same known predetermined positional relationship to the patterns of solder bumps 134 and contact pads 32, respectively, so as to allow easy alignment of B-staged rigid underfill preform 110 and substrate 30, as is described above in relation to rigid underfill preform 10 and substrate 30. In case where ultra-fine alignment, i.e. high-precision alignment, is required, the relational alignment holes may serve as a coarse alignment means in conjunction with an optical system for the finer alignment.

This arrangement of FIGS. 9 and 10 is particularly advantageous because the thickness of adhesive layer 12 determines the height of solder column 134 and therefore, the length of the solder interconnect formed thereby when a device or substrate is attached to a next-level substrate or circuit board by employing rigid adhesive underfill preform 110. As a result, the height of solder column 134 can be made significantly greater than can the height of a conventional solder bump. Conventionally, when solder paste or cream is deposited onto a contact pad and is then heated to reflow the solder to form a conventional solder bump, the melted solder tends toward a spherical shape due to surface tension, except where it wets to the contact pad, thereby limiting the height of the solder bump in relation to the size of the contact pad. The limited height of conventional solder bumps causes the distance between the device or substrate attached thereby to a next-level substrate or circuit board to be correspondingly limited, thereby producing solder interconnects of limited length, i.e. shorter length, that tend to increase the stress between the device or substrate and the next-level substrate or circuit board.

By employing the rigid adhesive underfill preform 110 of FIGS. 9 and 10 with a thicker adhesive layer 112, taller solder columns or solder bumps 134 and longer solder interconnects can be realized to reduce the stress in the solder interconnects both as a result of their increased length and of the stabilizing action of rigid adhesive underfill preform 110 being bonded to the device or substrate and to the next-level substrate or circuit board. In addition, the thicker bond lines of the rigid adhesive layer 112 also increase the distance over which such rigid adhesive may absorb stress which can also improve strain relief. In this embodiment of the invention, the solder columns or bumps 134 have a height that is typically in the range of about 100 to 250 microns. While greater film adhesive thicknesses and longer embedded solder columns or solder bumps may be used, they are preferred for very large devices or substrates only, in particular, flip-chips and other devices expected to become available over the next few years.

In the foregoing description, solder columns 134 were columns of solder paste or solder cream, however, solder bumps may be embedded in rigid adhesive underfill preform 110. The preferred insulating adhesive films 112 are thermoplastic-based resins having a high rigidity, i.e. a high modulus of elasticity, and a high glass transition temperature Tg. While solder columns 134 may be produced by many means and methods, one of the most cost-effective methods is to utilize a solder cream to fill the holes 114 for the conductor within the insulating adhesive layer 112. Solder creams are generally made of a polymer rosin dissolved in a solvent and loaded with very finely powdered solder of only a few microns diameter. Once the solder creams are filled into the holes 114 within the insulating adhesive layer 112, the solder cream may be heated to reflow and form solid columns 134 of solder. The temperature required to make solder reflow is typically in the range of 150–220° C., i.e. about 150° C. for indium solder and about 220° C. for typical tin-lead solder. Any residual rosin from the solder cream may need to be extracted using a suitable solvent. A high-temperature thermoplastic resin or a blend of such resins is preferred where solder columns 134 are reflowed solder because the high temperature needed to reflow the solder will most likely cause premature curing of most thermosetting resins and thereby render them useless for the subsequent bonding to a device, substrate or circuit board. In the processes utilized to reflow solder cream to form solid solder columns 134, a reducing environment may be preferred, and may enhance the soldering without requiring the use of rosin.

The arrangement of FIGS. 9 and 10 is also advantageous in that the processes of depositing solder paste onto a substrate and of heating the substrate to reflow the solder to form solder bumps in preparation for subsequent attachment of that substrate to a next-level substrate are eliminated. In addition, a flexible and easily handled B-staged rigid adhesive underfill preform 110 is available to be laminated to a substrate.

Figure 11:
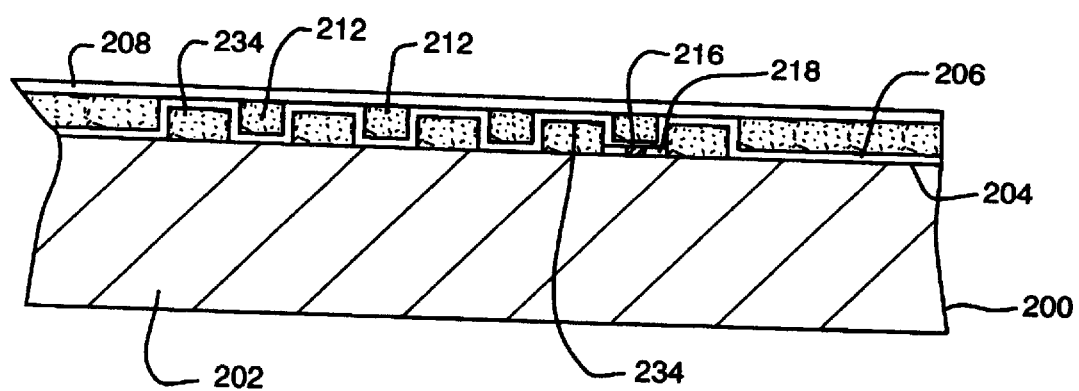
FIG. 11 is a cross-sectional view of a mold useful in an alternative method of making a rigid insulating film adhesive underfill preform in accordance with the present invention.

FIG. 11 is a cross-sectional view of a mold useful in an alternative method of making a rigid insulating film adhesive underfill preform in accordance with the present invention. First, a flat mold 200 is made to replicate the solder bumps formed on a semiconductor wafer or other substrate with which the rigid adhesive underfill preforms to be fabricated are to be employed. The mold 200 is made on a flat plate 202, for example, of stainless steel, having substantial thickness so as to be rigid and having a surface 204 thereof which has a precise controlled flatness on which a rigid adhesive underfill preform is to be formed. A pattern of bumps or features 234 is formed on surface 204 of mold plate 202 to replicate in size, shape and thickness the solder bumps and other features that will be on the semiconductor wafer or other substrate with which the rigid adhesive underfill preforms are to be utilized. While bumps and features 234 may be formed by any suitable method, it is preferred that a thermosetting or thermoplastic adhesive be deposited on surface 204 in the same pattern as the bumps and features of the semiconductor wafer will have. Preferably, bumps and features 234 are formed by depositing such adhesive on surface 204 of mold plate 202 and then curing (not B-staging or drying) the deposited adhesive, for example, by exposure to an elevated temperature for a period of time.

After the bumps 234 are formed on surface 204, mold 200 is coated with a thin coating 206 of a release agent (shown as a broad line in FIG. 11) so that the rigid adhesive underfill preform will not stick to the mold 200. Suitable release agents include a deposited thin film of diluted silicone that is spun to remove excess and achieve a suitably thin coating, and other materials selected to not react with or be contaminated by or contaminate the materials of which the rigid adhesive underfill preform is made. Typically, coatings of low surface energy materials such as silicones or polyethylene structure wax that are dissolvable by non-polar solvents, such as mineral spirits and the like, are suitable where the materials of which the rigid adhesive underfill preform are formed are typically dissolved by polar solvents. This criteria is desirable because it allows a release coating to be utilized that will not be dissolved by the typical epoxy adhesives of which the rigid adhesive underfill preform is formed, thereby to avoid the need to strip and re-coat mold 200 with release coating 206 after each use.

An adhesive material 212 is deposited onto coated mold 200, such as a thermosetting epoxy adhesive paste, that will form the adhesive layer 12, 112 of a rigid adhesive underfill preform 10, 110. Alternatively, a release liner 208 may be placed on top of the deposited adhesive paste 212 to assure uniform flatness and smoothness of the adhesive film 212, and the deposited adhesive paste is then dried or B-staged and the release liner is removed. More porous and "breathable" release liners, such as paper release liners, are preferred over solid plastic release liners, such as Teflon® glass mesh, for their ability to allow solvent to come out of the deposited adhesive 212 and thereby allow it to dry. Once the deposited adhesive paste 212 is dried or B-staged (with or without release paper 208), the B-staged rigid adhesive underfill preform may be removed from mold 200 and will include holes therethrough corresponding to the bumps and features 234 of mold 200, i.e. the bumps and features of the solder bumps, including relational alignment holes, if any, of the semiconductor wafer, circuit board or other substrate with which it will be utilized.

The B-staged rigid adhesive underfill preform made by the foregoing method may have the holes therein filled with solder paste or cream as described above or may be employed with devices and/or substrates that have solder bumps thereon. In addition, a network of ridges or raised lines 216, 218 may also be formed projecting from the surface 204 of flat mold 200, but not as far as do bumps 234, to define a network of channels in the surface of the rigid adhesive underfill preforms made on mold 200.

The properly formed B-staged rigid adhesive underfill preform will have a thickness within 10%–15%, but not more than 20%, of the height of such solder bumps. If the adhesive film is thicker than the height of the solder column or bumps, when the flip-chip device is placed against the substrate at elevated temperature, the adhesive will flow until the solder bumps touch the substrates and melt to form solder connections between the respective contact pads of the flip-chip and the substrate. If the adhesive film is thinner than the height of the solder column or bumps, when the flip-chip device is placed against the substrate at elevated temperature, the solder bumps touch the substrates, melt and are forced to flow and spread until the adhesive film touches the flip-chip and the substrate to form when cured a rigid adhesive underfill therebetween and the solder bumps when cooled form solder connections between the respective contact pads of the flip-chip and the substrate. Under either condition, where the flip chip is pressed against the substrate with suitable temperature and pressure, substantial flow of the rigid adhesive underfill preform forms a fillet along the edges of the flip chip, and suitable void-free bonding between the flip chip and the substrate provides the required strain relief for reliable attachment.

EXAMPLE 1

An insulating film adhesive loaded with quartz powder to reduce the CTE of the filled adhesive material to less than 40 ppm/° C., such as type ESP7673 thermosetting epoxy adhesive available from AI Technology, Inc. located in Princeton, N.J., is utilized to form an insulating adhesive film having a thickness of 5 mils, i.e. 125 microns, which is similar to, but slightly less than, the height of the solder bumps incorporated on the semiconductor wafer with which it is to be utilized. The film of ESP7673 adhesive is B-staged at a temperature of about 60° C. for about 60 minutes and a pattern of holes are cut in the adhesive film by a mechanical die or punch or by laser drilling to form a rigid adhesive underfill preform. A simple cutting die may not work where the diameter of the holes to be formed is small, for example, 4–10 mils, and so a complementary set of tools forming a punch or laser drilling is employed. The pattern of holes corresponds to the pattern of bond pads on a semiconductor wafer and includes sets of holes for a plurality of semiconductor devices formed on that wafer. The semiconductor wafer is modified from the traditional aluminum bond pads to have nickel gold contacts. Other solderable contact materials, such as titanium/tungsten, may be utilized in place of the non-solderable aluminum bond pads. Solder cream having very finely powdered solder, which are widely available commercially such as from Alpha Metal located in Warwick, R.I., and from the Indium Corporation in Utica, N.Y., is deposited on the solderable bond pads of the semiconductor wafer. The deposited solder bumps are then reflowed to form solid solder bumps and any residual flux is cleaned off thoroughly using a suitable compatible solvent, such as an isopropyl alcohol or other alcohol-based solvent. The solder bumps thus formed have a diameter of 200 microns and an average height of 150 microns, and are at a 400-micron pitch. Suitable relational alignment holes on the underfill preform that are cut out when the pattern of holes therein are cut out, are aligned with corresponding relational alignment holes on the semiconductor wafer. The rigid adhesive underfill preform of B-staged type ESP7673 adhesive is pressed against the semiconductor wafer with 10 psi pressure and is laminated thereto at a temperature of 80–100° C. for approximately 30 seconds. A short duration application of oxygen plasma or other suitable treatment is used to etch off the minor residuals of resin on the solder bumps. Alternatively, a suitable particle-free wipe soaked with a suitable compatible solvent such as NMP (normal methol pyrolidone) can placed on top the adhesive underfill preform and semiconductor wafer with for approximately 1 minute and then removed. The semiconductor wafer with rigid adhesive underfill preform laminated thereto is then dried thoroughly at a temperature below 60° C. to avoid any additional curing of the adhesive. The semiconductor wafer is cut into individual semiconductor dies using a suitable dicing saw, which is the conventional method that utilizes the same reference sites typically available in the Gerber plot of the wafer that sites the contact pads. The dicing saw that cuts the semiconductor wafer cuts the rigid adhesive underfill preform at the same time. These individual dies, each of which has a portion the rigid adhesive underfill preform laminated thereto, are now ready for subsequent bonding with a next-level circuit board that has contacts coated with metal passivation suitable for soldering. The individual die are soldered onto the next-level circuit board by a suitable flip-chip bonding machine of the sort commonly used for flip-chip bonding. In this example, the next-level circuit board substrate is preheated to a temperature of 250° C. which is about 30° C. above the normal solder reflow temperature. Once the solder bumps on the semiconductor die touch the hot contact pads on the circuit board, they melt and reflow onto those contact pads. When the insulating film adhesive of the underfill preform touches the next-level circuit board, it is induced to flow by the 5–10 psi pressure that is commonly applied during solder reflow bonding, and flows to fill in all of the available free space between the semiconductor die and the next-level circuit board. Because the semiconductor die is kept at a temperature closer to 80° C., the solder bumps cool off quickly while the adhesive is allowed to continue to flow. The bonding pressure is released after a fillet of the rigid adhesive is formed along the edge of the semiconductor die. The bonded device may be post-cured in a belt oven or a batch oven for an additional 5 to 60 minutes at a temperature of 150° C. without pressure being applied. The cured type ESP7673 rigid adhesive has a bond strength of over 6000 psi die-shear and a modulus of elasticity of 2,000,000 psi at temperatures below its glass transition temperature Tg of 160° C.

EXAMPLE 2

A rigid adhesive underfill preform having its holes corresponding to contact pads on a panel including a plurality of circuit boards empty of electronic components includes a set of relational alignment holes corresponding to a like set on the panel. An adhesive film is formed of type LESP7673 thermosetting epoxy adhesive available from AI Technology, Inc., which is the liquid version of the type ESP7673 adhesive utilized in Example 1. The liquid adhesive is stenciled onto a release liner at a controlled viscosity preferably between 150,000 and 250,000 cps at 0.5 rpm, although adhesive with viscosity as low as 50,000 or as high as 600,000 cps could be utilized. A mask or stencil or screen may be used. In this case, a stencil having blinds or covers in the same pattern as the holes corresponding to the conductive pads and relational alignment holes is employed. The thickness of the stencil is 8 mils so that the finished thickness of the B-staged film adhesive is approximately 5 mils, and the tie bars holding the covers in position are 8 mils wide. The liquid paste adhesive is stenciled onto the release liner with the suitable pattern and is then B-staged at a temperature of 60° C. for 30–60 minutes until it is thoroughly dry to the touch. Once the film is dried and B-staged, it is an adhesive film having the same properties as that formed of ESP7673. Individual flip-chip semiconductor devices from a semiconductor wafer as in Example 1 are employed, having solder bumps of 200-micron diameter and 400-micron pitch and an average height of 150 microns thereon. The diameter of each cover or blind of the stencil is 250 microns, which is slightly larger than the 200-micron diameter of the solder bumps on the semiconductor devices with which the adhesive underfill preform is employed. The B-staged rigid adhesive underfill preform with relational alignment holes corresponding to those of the panel of circuit boards is laminated over the panel of individual circuit boards at a temperature of 80–100° C. and they are pressed together with a pressure of 10 psi for a time as short as 30 seconds. The individual circuit boards of the panel of circuit boards having the B-staged rigid adhesive underfill preform laminated thereto are then excised into individual circuit boards for subsequent assembly as a next-level substrate for receiving flip-chip devices. The attachment of flip-chip devices to the next-level substrate to form an electronic device is performed with a heated chuck that maintains the temperature of the semiconductor flip-chip at 250° C. under a reducing environment to prevent undesirable oxidation of the solder bumps. The heated chuck places the heated semiconductor flip-chip against the next-level substrate at the desired location with the solder bumps of the semiconductor flip-chip within the slightly oversize holes of the B-staged rigid adhesive underfill preform laminated to the individual circuit board, as illustrated in FIG. 7 without the circuit board. When the solder bumps touch the circuit board substrate, which is maintained at a temperature of 100–150° C., i.e. below the melting temperature of the solder, they flow and solidify quickly. The adhesive film of the B-staged rigid adhesive underfill preform will continue to flow until a fillet forms around the edges of the flip-chip device. The assembled electronic device can than be passed on for post-curing utilizing either belt oven or a batch oven at a temperature of 100–175° C. for a time sufficient to fully cure the rigid adhesive underfill preform. The type LESP7673 adhesive has a bond strength of over 6000 psi die-shear and a modulus of elasticity of over 2,000,000 psi up to its glass transition temperature of 160° C. In other examples, the size of the holes in the rigid adhesive underfill preform is the same as that of the solder column or bump on the substrate as illustrated in FIG. 8.

EXAMPLE 3

A rigid adhesive underfill preform having its holes corresponding to contact pads on a panel including a plurality of circuit boards empty of electronic components includes a set of relational alignment holes corresponding to a like set on the panel. An adhesive film is formed of type LESP7675 thermosetting epoxy adhesive available from AI Technology, Inc. Type LESP7675 is a liquid version of the type ESP7675 adhesive and utilizes the same polymer resins as utilized in the types ESP7673 and LESP7673 adhesives of Examples 1 and 2. Instead of quartz powders as utilized in the type ESP7673 adhesives, however, type LESP7675 adhesive is filled with 55% by volume of alumina particles having a particle size of about 8 microns. Alumina provides higher thermal conductivity, for example, over 1.5 watt-m/° K, than does quartz, as well as also controlling the CTE of the filled adhesive to be less than 40 ppm/° C. The liquid adhesive is stenciled onto a release liner at a controlled viscosity of 150,000 to 250,000 cps at 0.5 rpm. A mask or stencil or screen may be used. In this case, a stencil having blinds or covers in the same pattern as the holes corresponding to the conductive pads and relational alignment holes is employed. The thickness of the stencil is 8 mils so that the finished thickness of the B-staged film adhesive is approximately 5 mils, and the tie bars holding the covers in position are 8 mils wide. The liquid paste adhesive is stenciled onto the release liner with the suitable pattern and is then B-staged at a temperature of 60° C. for 30–60 minutes until it is thoroughly dry to the touch. Once the adhesive film is dried and B-staged, it is an adhesive film having the same properties as that formed of type ESP7675 adhesive. Individual flip-chip semiconductor devices from a semiconductor wafer as in Example 1 are employed, having solder bumps of 200-micron diameter and 400-micron pitch and an average height of 150 microns thereon. The diameter of each cover or blind of the stencil is 250 microns, which is slightly larger than the 200-micron diameter of the solder bumps on the semiconductor devices with which the adhesive underfill preform is employed. The B-staged rigid adhesive underfill preform with relational alignment holes corresponding to those of the panel of circuit boards is laminated over the panel of individual circuit boards at a temperature of 80–100° C. and they are pressed together with a pressure of 10 psi for a time as short as 30 seconds. The individual circuit boards of the panel of circuit boards having the B-staged rigid adhesive underfill preform laminated thereto are then excised into individual circuit boards for subsequent assembly as a next-level substrate for receiving flip-chip devices. The attachment of flip-chip devices to the next-level substrate to form an electronic device is performed with a heated chuck that maintains the temperature of the semiconductor flip-chip at 250° C. under a reducing environment to prevent undesirable oxidation of the solder bumps. The heated chuck places the heated semiconductor flip-chip against the next-level substrate at the desired location with the solder bumps of the semiconductor flip-chip within the slightly oversize holes of the B-staged rigid adhesive underfill preform laminated to the individual circuit board, as illustrated in FIG. 7 without the circuit board. When the solder bumps touch the circuit board substrate, which is maintained at a temperature of 100–150° C., i.e. below the melting temperature of the solder, they flow and solidify quickly. The adhesive film of the B-staged rigid adhesive underfill preform will continue to flow until a fillet forms around the edges of the flip-chip device. The assembled electronic device can than be passed on for post-curing utilizing either belt oven or a batch oven at a temperature of 100–175° C. for a time sufficient to fully cure the rigid adhesive underfill preform. The type LESP7673 adhesive has a bond strength of over 6000 psi die-shear and a modulus of elasticity of over 2,000,000 psi up to its glass transition temperature of 160° C.

EXAMPLE 4

A rigid adhesive underfill preform including solder columns in the holes therein is laminated to a semiconductor wafer that is then separated into flip-chip devices for assembly to a next-level substrate. The rigid underfill preform is formed of a film of thermoplastic film adhesive type LTP7955, available from AI Technology, which is filled with 55% by volume of 8-micron alumina particles to reduce its CTE to about 35 ppm/° C. and increase its thermal conductivity to about 1.5 watt-m/° K. Type LTP7955 is the liquid version of type TP7955 paste adhesive. The liquid LTP7955 adhesive is stenciled onto a Teflon® polytetrafluoroethylene release liner at a controlled viscosity of 150,000 to 250,000 cps at 0.5 rpm. A mask or stencil or screen may be used. In this example, a stencil including 225-micron diameter blinds or covers in a pattern corresponding to that of the conductive pads on the semiconductor wafer with which it is to be employed and defining relational alignment holes located in known predetermined relationship to the pattern of holes is employed. The thickness of the stencil is 8 mils so that the finished thickness of the B-staged adhesive film is approximately 5 mils. The film of liquid paste adhesive with the desired pattern of holes therein is then B-staged at 60–100° C. for 30–60 minutes until they are thoroughly dry to the touch. When dried and B-staged, the adhesive film formed of type LTP7955 adhesive has the same properties as does a film formed of type TP7955 adhesive. Similar to Example 2, the adhesive preforms thus far formed have all of the holes therein corresponding to contact pads of the device or substrate with which it is to be employed left empty, and has a set of relational alignment holes corresponding to a set of relational alignment holes in the semiconductor wafer to which it is to be laminated. The holes in the B-staged adhesive film corresponding to contact pads are filled with solder cream including very finely powdered solder as described in Example 1, as by screen printing or stenciling. The solder-cream-filled adhesive film is placed onto a heated hot plate to reflow the columns of solder cream into columns of solid solder, i.e. solder bumps, embedded in the adhesive sheet, for example, as illustrated in FIG. 9. The Teflon® sheet release liner supports the B-staged rigid adhesive underfill preform during the solder reflow operation which is performed at a temperature of 220–250° C. While the thermoplastic adhesive is also softened during the solder reflow operation, it maintains its shape because no pressure is applied. A semiconductor wafer having contact pads of 200-micron diameter at a 400-micron pitch for receiving solder bumps, which diameter of the contact pad is slight larger than the 225-micron diameter of the solder bumps in the B-staged rigid adhesive underfill preform. The B-staged rigid adhesive underfill preform having the reflowed solder columns therein is aligned with and laminated to the semiconductor wafer using the respective sets of relational alignment holes therein at a temperature of 220–250° C. under a pressure of 10 psi for as short as 30 seconds. During this lamination process, the solder columns or bumps melt and directly reflow onto the semiconductor wafer contact pads, as illustrated by FIG. 10. A reducing atmosphere is preferred to reduce undesirable oxidation during this relatively high temperature operation. The semiconductor wafer is then excised into individual semiconductor die, i.e. flip-chips, for assembly with the next-level substrate or circuit board. The flip-chips are attached to is performed with heated chuck that places the semiconductor flip chip on the next level substrate or circuit board. The flip-chip having the B-staged rigid adhesive underfill preform laminated thereto is heated to and maintained at a temperature of 250° C. by the heated chuck and is preferably kept in a reducing environment to prevent undesirable oxidation. When the heated flip-chip is placed against the substrate by the heated chuck, the solder bumps touch the substrate, which is maintained at a temperature of 200–220° C., i.e. slightly below the melting temperature of the solder, they flow quickly and then solidify to form solder interconnects between the contact pads on the semiconductor die flip chip and the corresponding contact sites on the substrate. The adhesive film of the B-staged rigid adhesive underfill preform continues to flow until a fillet forms around the edges of the flip-chip device, for example, as illustrated in FIG. 6. Unlike the rigid adhesive underfill preforms of Examples 1–3 which employ thermosetting film adhesives, no post-curing is required for the finished electronic device employing a rigid adhesive underfill preform including thermoplastic adhesive. Type TP7955 thermoplastic adhesive has a bond strength of over 1000 psi die-shear and a modulus of elasticity of 1,000,000 psi up to its glass transition temperature Tg of 180° C.

EXAMPLE 5

A rigid adhesive underfill preform is fabricated by a molding method for use with a semiconductor wafer. A 10-inch by 10-inch flat plate of ½-inch thick stainless steel is obtained and is finished to 0.500-inch thickness with its opposing broad surfaces parallel to within a tolerance of 0.001 inch. Features replicating the solder bumps on a semiconductor wafer are formed on one surface thereof by depositing type ESP7675 thermosetting adhesive paste available from AI Technology thereon. Typically, the solder bumps are about 6-mils in diameter and so the deposited bumps of adhesive are of like or slightly larger diameter, but in any event are of the size and shape, and in the pattern, corresponding to that of the particular semiconductor wafer or other substrate with which the rigid adhesive underfill preform is to be employed. The stencil utilized for depositing the ESP7675 adhesive is 5-mils thick and the deposited adhesive is cured at a temperature of 150° C. for 60 minutes to form bumps having a height of about 3 mils that are part of the flat mold including the stainless steel plate. After the cured bumps are formed on the flat mold plate, a thin coating of moisture-curing silicone adhesive release film, diluted to a low viscosity of 100 to 1000 cps is applied, such as by spraying or dipping and spinning, to achieve a suitably thin coating. A proper coating should be in the range of 10–15 microns thick, and not more than 25-microns thick. This silicone coating acts as a mold release for the B-staged rigid adhesive underfill preform to be formed thereon. After the release coating is established, type LESP7675 liquid thermosetting epoxy adhesive is roll coated onto the flat mold at the thickness established by the bump features thereon. The deposited wet adhesive film is B-staged at a temperature of 60–80° C., which is well below the 150° C. curing temperature thereof, for 60 minutes, and is then removed from the mold. Because the typical solder bumps have a diameter of 6 mils in this example, the B-staged rigid adhesive underfill preform may be placed on a semiconductor wafer or substrate panel and visually aligned therewith. The B-staged rigid adhesive underfill preform is laminated to the semiconductor wafer or substrate at a temperature of about 80° C. using a vacuum bag or a rubber roller.

The rigid adhesive underfill preforms of Examples 1–5 are expected to be satisfactory to attach semiconductor die having an edge dimension as large as 500 mils to next-level substrates made of ceramic and FR4 materials and to withstand thermal cycling between −55° C. and +150° C. without solder interconnect failure. Each of rigid adhesives ESP7673, LESP7673, ESP7675, LESP7675, TP7955 and LTP7955 has a melt flow index of at least 1.5, and typically greater than 1.5 at a temperature of 150° C. and a pressure of 10 psi, and has a modulus of elasticity of at least 1,000,000 psi.

The insulating or dielectric adhesive underfill preforms according to the present invention are made with materials that remain rigid and high in modulus of elasticity over a substantial portion of the temperature range over which the packaged electronic device in which they are employed is specified or required to operate or withstand.

Among the methods and processes that can be utilized for making proper holes, including sets of relational guide holes, in the adhesive film of the rigid adhesive underfill preform, the method selected will depend substantially upon the scale of the dimensions and pitch of the holes, and cost. Larger holes such as those more commonly used in packaged components and jumpers that may be as large as 1000 to 10,000 microns or larger, can be readily made by die cutting the sheet of insulating adhesive film and then used as is or by "back-filled" with solder paste or cream, as by screening, stenciling or masking.

Fine pitch and small dimension holes, such as holes 25 to 500 micron in dimension, are more difficult and expensive to make. Current photo-etching processes can form holes of approximately 75 micron dimension and 150 micron pitch. In such applications, it is important to ensure proper sets of relational alignment holes are incorporated to facilitate placement and alignment of the rigid adhesive underfill preform.

While the present invention has been described in terms of the foregoing exemplary embodiments, variations within the scope and spirit of the present invention as defined by the claims following will be apparent to those skilled in the art. For example, the adhesives of which preforms 10, 110 are formed may be filled with certain materials to tailor their characteristics to a particular application. Thermal conduction of the adhesive may be increased by the addition of particles of a high-thermal conductivity material, such as alumina ($Al_2O_3$), aluminum nitride (AlN), boron nitride (BN), silicon carbide (SiC), zinc oxide (ZnO), magnesium oxide (MgO)or diamond, which fillers may also be employed to modify the coefficient of thermal expansion thereof. The coefficient of thermal expansion thereof may also be reduced by the addition of particles of quartz or glass silicates, for example. Particulate fillers typically comprise 30–65% by volume of the adhesive.

In addition to the alignment using relational alignment holes as described herein, rigid adhesive underfill preforms, flip chips and other electrical and electronic devices, and semiconductor wafers, dies, circuit boards and other substrates may also be aligned visually or using suitable optical alignment equipment, as circumstances may make necessary or convenient.

Further, the method of making underfill preforms using a flat mold 200 described in relation to FIG. 11 is not limited to making underfill preforms of rigid adhesives, but may be employed to make adhesive underfill preforms of other materials, such as flexible thermoplastic and thermosetting adhesives.

What is claimed is:

1. A rigid adhesive underfill preform for adhesively attaching an electronic device to a substrate having a pattern of contact sites thereon corresponding to a pattern of contacts of the electronic device, and to include solder bumps, said rigid adhesive underfill preform comprising: a layer of adhesive material having a pattern of holes therethrough corresponding to the pattern of contact sites of the substrate, said layer of adhesive material having a thickness substantially similar to a height of the solder bumps, and wherein said adhesive material is rigid when cured and has a flow index greater than about 1.2 at a temperature T and a pressure P, wherein the flow index is the ratio of the area covered by the adhesive material after curing at a temperature T and a pressure P to the area of the adhesive material before curing.

2. The rigid adhesive underfill preform of claim 1 further comprising solder substantially filling the holes in said layer of adhesive material, wherein the substrate includes the solder bumps on the contact sites thereof, and wherein said layer of adhesive material is laminated to the substrate with the solder bumps of the substrate positioned in the holes of said layer of adhesive material.

3. The rigid adhesive underfill preform of claim 1 further comprising solder substantially filling the holes in said layer of adhesive material, whereby said solder is the solder bumps.

4. The rigid adhesive underfill preform of claim 3 wherein said solder substantially filling the holes in said layer of adhesive material is in the form of a solder paste or a solder cream.

5. The rigid adhesive underfill preform of claim 4 wherein said solder paste or solder cream is reflowed in the holes in said adhesive layer.

6. The rigid adhesive underfill preform of claim 1 wherein said layer of adhesive material is formed by depositing said adhesive material with a stencil, said stencil including a plurality of covers positioned for defining the holes in said layer of adhesive material.

7. The rigid adhesive underfill preform of claim 1 wherein said layer of adhesive material is formed by depositing said adhesive material onto a flat surface of a mold, said mold having a pattern of features projecting from the flat surface thereof for defining the holes in said layer of adhesive material.

8. The rigid adhesive underfill preform of claim 1 wherein said adhesive material when cured has a modulus of elasticity of at least 1,000,000 psi at temperatures below its glass transition temperature.

9. The rigid adhesive underfill preform of claim 8 wherein the glass transition temperature of said adhesive material is not less than 85° C.

10. The rigid adhesive underfill preform of claim 1 wherein said adhesive material is selected from the group consisting of thermoplastic and thermosetting materials, and blends and combinations thereof.

11. The rigid adhesive underfill preform of claim 1 wherein the difference between the thickness of said layer of adhesive material and the height of the solder bumps is less than twenty percent (20%).

12. The rigid adhesive underfill preform of claim 1 in combination with the substrate having the pattern of contact sites thereon and with a next-level substrate having a corresponding pattern of contact sites thereon, wherein opposing surfaces of said rigid adhesive underfill preform are bonded to said substrate and to said next-level substrate, respectively, and wherein the respective corresponding contact sites of said substrate and said next-level substrate are connected together by the solder bumps.

13. The rigid adhesive underfill preform of claim 1 wherein the flow index of said adhesive material is at least 1.5.

14. The rigid adhesive underfill preform of claim 1 wherein the temperature T is in the range of 150–250° C. and the pressure P is less than 30 psi.

15. The rigid adhesive underfill preform of claim 1 wherein the temperature T is less than the reflow temperature of solder and the pressure P is less than 100 psi.

16. A rigid adhesive underfill preform for a substrate having a pattern of contact sites thereon and to include solder bumps comprising:
   a layer of adhesive material having a pattern of holes therethrough corresponding to the pattern of contact sites of the substrate,
   said layer of adhesive material having a thickness substantially similar to a height of the solder bumps, and
   wherein said adhesive material is rigid when cured and has a flow index greater than about 1.2 at a temperature T and a pressure P,
   wherein the flow index is the ratio of the area covered by the adhesive material after curing at a temperature T and a pressure P to the area of the adhesive material before curing,
   wherein said layer of adhesive material has a network of channels in at least one surface thereof.

17. The rigid adhesive underfill preform of claim 16 wherein said layer of adhesive material is formed by depositing said adhesive material with a stencil, said stencil including a plurality of covers positioned for defining the holes in said layer of adhesive material and having tie bars holding said covers in position, wherein said tie bars define said channels.

18. A rigid adhesive underfill preform for a substrate having a pattern of contact sites thereon and to include solder bumps comprising:
   a layer of adhesive material having a pattern of holes therethrough corresponding to the pattern of contact sites of the substrate,
   said layer of adhesive material having a thickness substantially similar to a height of the solder bumps, and
   wherein said adhesive material is rigid when cured and has a flow index greater than about 1.2 at a temperature T and a pressure P,
   wherein the flow index is the ratio of the area covered by the adhesive material after curing at a temperature T and a pressure P to the area of the adhesive material before curing,
   wherein said layer of adhesive material is formed by depositing said adhesive material with a stencil,
   said stencil including a plurality of covers positioned for defining the holes in said layer of adhesive material and tie bars holding said covers in position, wherein said tie bars define channels in a surface of said layer of adhesive material.

19. A rigid adhesive underfill preform for a substrate having a pattern of contact sites thereon and to include solder bumps comprising:
   a layer of adhesive material having a pattern of holes therethrough corresponding to the pattern of contact sites of the substrate,
   said layer of adhesive material having a thickness substantially similar to a height of the solder bumps, and
   wherein said adhesive material is rigid when cured and has a flow index greater than about 1.2 at a temperature T and a pressure P,
   wherein the flow index is the ratio of the area covered by the adhesive material after curing at a temperature T and a pressure P to the area of the adhesive material before curing,
   wherein said layer of adhesive material is formed by depositing said adhesive material onto a flat surface of a mold,
   said mold having a pattern of features projecting from the flat surface thereof for defining the holes in said layer of adhesive material, and
   wherein said mold has a pattern of raised ridges on the flat surface thereof, the height of the ridges being less than that of the pattern of features thereon, wherein the raised ridges define channels in a surface of the layer of adhesive material.

20. A rigid adhesive underfill preform for a substrate having a pattern of contact sites thereon and to include solder bumps comprising:
   a layer of adhesive material having a pattern of holes therethrough corresponding to the pattern of contact sites of the substrate,
   said layer of adhesive material having a thickness substantially similar to a height of the solder bumps, and
   wherein said adhesive material is rigid when cured and has a flow index greater than about 1.2 at a temperature T and a pressure P,
   wherein the flow index is the ratio of the area covered by the adhesive material after curing at a temperature T and a pressure P to the area of the adhesive material before curing,
   wherein said adhesive material includes particulate filler selected from the group consisting of quartz, silica, glass silicates, alumina, aluminum nitride, boron nitride, silicon carbide, zinc oxide, magnesium oxide and diamond, and combinations thereof.

21. A rigid adhesive underfill preform for adhesively attaching an electronic device to a substrate having a pattern of contact sites thereon corresponding to a pattern of contacts of the electronic device, and to include solder bumps, said rigid adhesive underfill preform comprising:
   a layer of rigid adhesive material for adhering to the substrate and having a pattern of holes therethrough corresponding to the pattern of contact sites of the substrate,
   said layer of rigid adhesive material having a thickness substantially similar to a height of the solder bumps,
   wherein said rigid adhesive material includes:
   (a) a rigid thermoplastic adhesive having a flow index greater than about 1.2 when melt-flowed at a temperature T and a pressure P,
   (b) a rigid thermosetting adhesive having a flow index greater than about 1.2 when cured at a temperature T and a pressure P, or
   (c) a blend of (a) and (b), and
   wherein the flow index is the ratio of the area covered by the rigid adhesive material after curing at a temperature T and a pressure P to the area of the rigid adhesive material before curing.

22. The rigid adhesive underfill preform of claim 21 wherein the temperature T is in the range of 150–250° C. and the pressure P is less than 30 psi.

23. The rigid adhesive underfill preform of claim 21 wherein the temperature T is less than the reflow temperature of solder and the pressure P is less than 100 psi.

24. The rigid adhesive underfill preform of claim 21 wherein said layer of rigid adhesive material has a network of channels in at least one surface thereof.

* * * * *